United States Patent
Foggiato et al.

[11] Patent Number: 6,049,086
[45] Date of Patent: Apr. 11, 2000

[54] LARGE AREA SILENT DISCHARGE EXCITATION RADIATOR

[75] Inventors: Giovanni Antonio Foggiato, Morgan Hill; Leonid V. Velikov, San Carlos; Ralph F. Manriquez, Saratoga; Ashraf R. Khan, Fremont, all of Calif.

[73] Assignee: Quester Technology, Inc., Fremont, Calif.

[21] Appl. No.: 09/022,507

[22] Filed: Feb. 12, 1998

[51] Int. Cl.[7] .................................................. H01J 17/38
[52] U.S. Cl. .................... 250/504 R; 313/609; 313/612; 313/631; 313/634
[58] Field of Search ........................ 250/504 R; 313/609, 313/612, 634, 631

[56] References Cited

U.S. PATENT DOCUMENTS

| | | | |
|---|---|---|---|
| 4,320,301 | 3/1982 | Kogelschatz et al. | 422/186.18 |
| 4,385,261 | 5/1983 | Kogelschatz et al. | 315/170 |
| 4,410,495 | 10/1983 | Bässler et al. | 422/186.18 |
| 4,461,744 | 7/1984 | Erni et al. | 422/186.18 |
| 4,837,484 | 6/1989 | Eliasson et al. | 313/634 |
| 4,843,281 | 6/1989 | Mendelsohn | 313/631 |
| 4,945,290 | 7/1990 | Eliasson et al. | 315/246 |
| 4,983,881 | 1/1991 | Eliasson et al. | 313/607 |
| 5,006,758 | 4/1991 | Gellert et al. | 313/634 |
| 5,013,959 | 5/1991 | Kogelschatz | 313/36 |
| 5,049,777 | 9/1991 | Mechtersheimer | 313/634 |
| 5,051,380 | 9/1991 | Maeda et al. | 451/238 |
| 5,118,989 | 6/1992 | Egermeier et al. | 313/631 |
| 5,173,638 | 12/1992 | Eliasson et al. | 313/634 |
| 5,185,552 | 2/1993 | Suzuki et al. | 313/231.71 |
| 5,198,717 | 3/1993 | Kogelschatz et al. | 313/17 |
| 5,214,344 | 5/1993 | Kogelschatz et al. | 313/17 |
| 5,386,170 | 1/1995 | Kogelschatz et al. | 313/17 |
| 5,387,546 | 2/1995 | Maeda et al. | 437/174 |
| 5,432,398 | 7/1995 | Kogelschatz et al. | 313/25 |
| 5,484,749 | 1/1996 | Maeda et al. | 437/238 |
| 5,489,553 | 2/1996 | Chen | 437/195 |
| 5,510,158 | 4/1996 | Hiramoto et al. | 427/582 |
| 5,536,681 | 7/1996 | Jang et al. | 437/19 |
| 5,581,152 | 12/1996 | Matsuno et al. | 313/634 |

FOREIGN PATENT DOCUMENTS 0661 110 A1  7/1995  European Pat. Off. .......... B08B 7/00

OTHER PUBLICATIONS

Camenzind, M., et al., Organic Compounds of Wafers, Balazs News, Balazs Analytical Laboratories, pp. 1–2.

Fujino, K., et al., Surface Modification of Base Materials for TEOS/O₃ Atmospheric Pressure Chemical Vapor Deposition, J. Electrochem. Soc., vol. 139, No. 6, 1690–1692, (Jun. 1992).

Matsuura, M., et al., Substrate–Dependent Characteristics of APCVD Oxide Using TEOS AND Ozone, Extended Abstract of the 22$^{nd}$ (1990 International) Conference on Solid State Devices and Materials, Sendai, pp. 239–242, (1990).

Fujino, K., et al., Dependence of Deposition Characteristics on Base Materials in TEOS and Ozone CVD at Atmospheric Pressure, J. Electrochem. Soc., vol. 138, No. 2, pp. 550–554, (Feb. 1991).

(List continued on next page.)

*Primary Examiner*—Jack I. Berman
*Attorney, Agent, or Firm*—Fliesler Dubb Meyer & Lovejoy LLP

[57] ABSTRACT

Ultraviolet and vacuum ultraviolet radiators for use in the manufacture of semiconductors are provided which have improved lifetimes, improved distribution of radiation generation, improved distribution of emitted radiation, increased efficiency of radiation emission, and improved means for cooling. The radiators have novel electrodes, novel electrode configurations, novel means for distributing plasmas between electrodes, and have novel cooling means. These features enable the miniaturization of the radiators permitting high-intensity and uniform radiation exposure of planar surfaces. The radiators are used in the pre-treatment of semiconductor surfaces, the deposition of semiconductor thin films, and the post-deposition processing of semiconductor thin films.

56 Claims, 8 Drawing Sheets

OTHER PUBLICATIONS

Kwok, K., et al., Surface Related Phenomena in Integrated PECVD/Ozone–TEOS SACVD Processes for Sub–Half Micron Gap Fill: Electrostatic Effects, J. Electrochem. Soc., vol. 141, No. 8, pp. 2172–2177, (Aug. 1994).

Mitsubishi Electric Corporation, Clean Ozonizer.

Newman, D.S., et al, The Dielectric Barrier Discharge: A Bright Spark for Australia's Future, Aust., J. Phys., 48, pp. 543–556, (1995).

Camenzind, M., et al., How clean is your cleanroom air?, Micro Contamination Identification, Analysis, and Control, (Oct. 1995).

Kazumoto, M., et al., Theoritical and Experimental Investigation on High Density Ozone Generation by Silent Discharge, Advanced Technology R&D Center, Mitsubishi Electric Corporation.

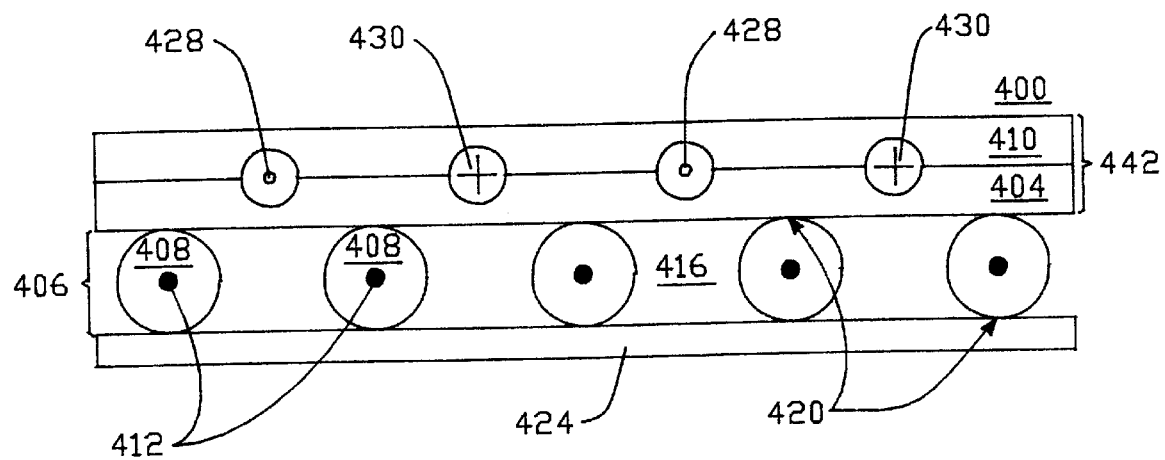
FIG.—4

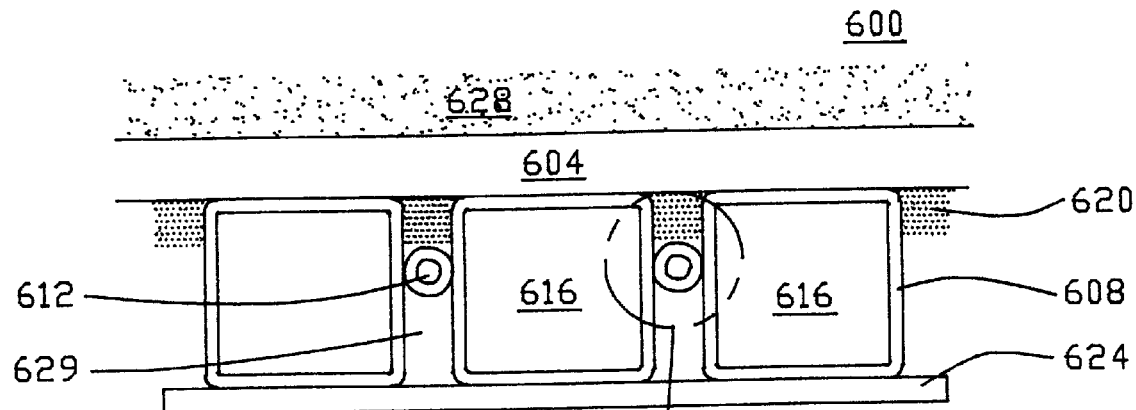
FIG.—6a
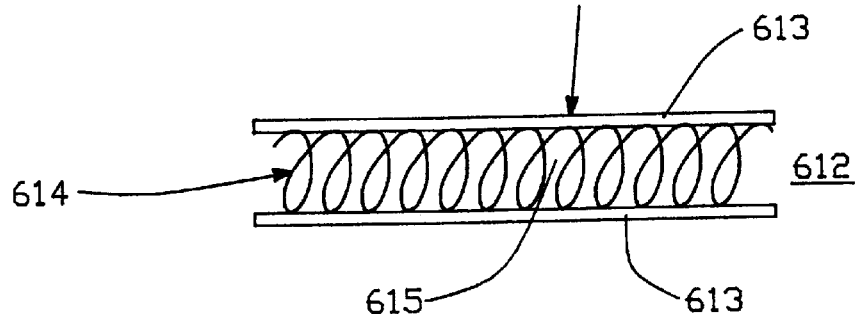
FIG.—6b
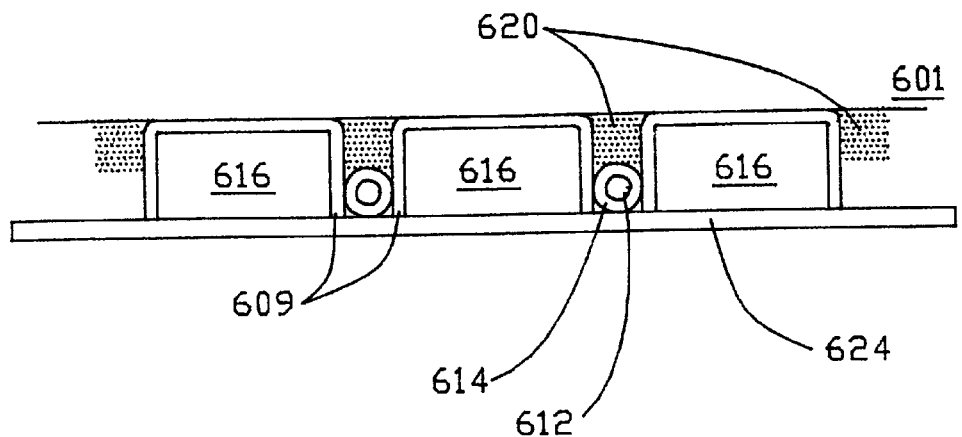
FIG.—6c

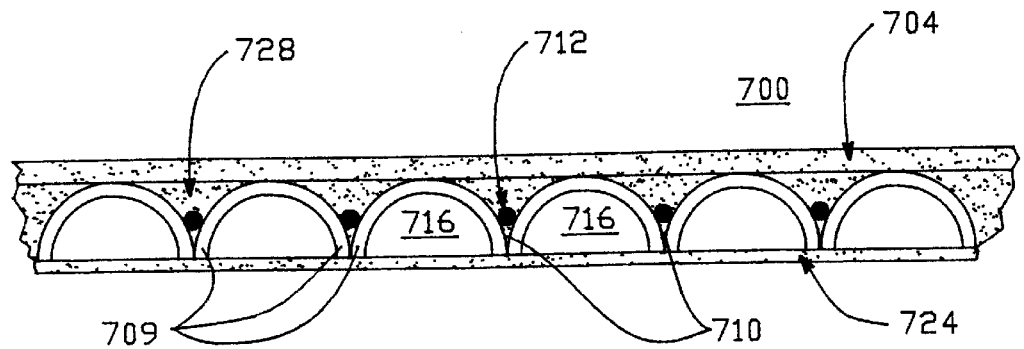
FIG.—7a
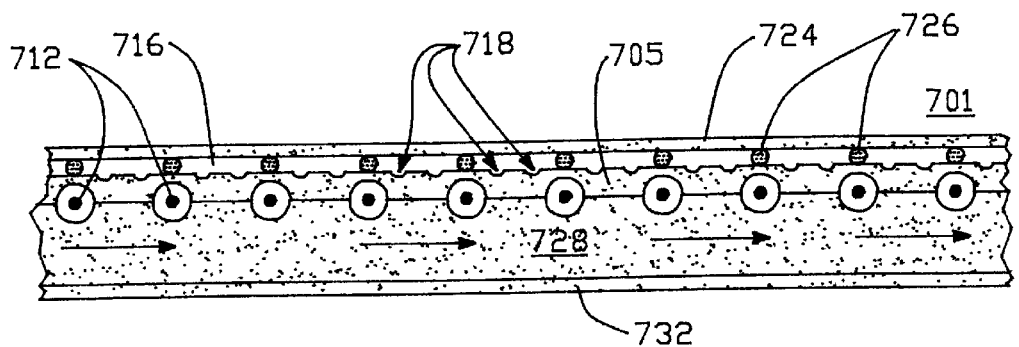
FIG.—7b
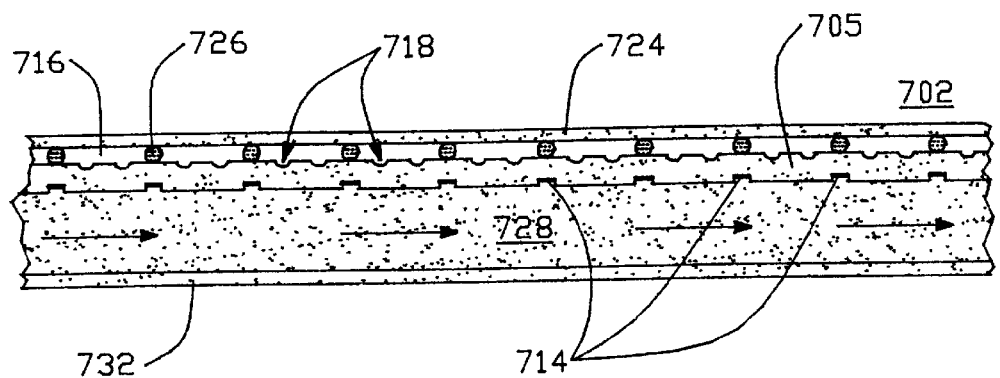
FIG.—7c
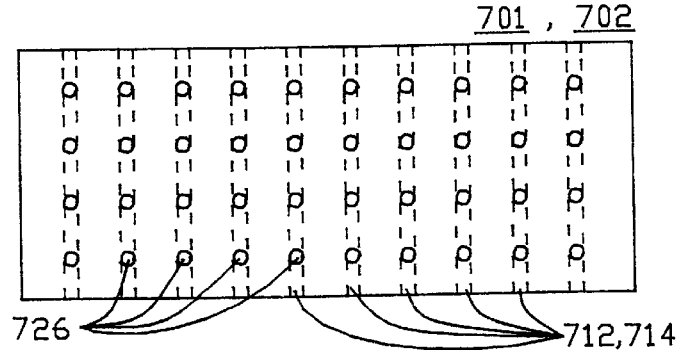
FIG.—7d

LARGE AREA SILENT DISCHARGE EXCITATION RADIATOR

BACKGROUND OF THE INVENTION

I. Field of the Invention

The present invention relates to the field of devices for the generation of electromagnetic radiation of the ultraviolet and vacuum ultraviolet wavelengths useful in the manufacture and processing of semiconductor devices.

II. Discussion of the Related Art

A. Semiconductor Manufacturing Problems

The manufacture of semiconductor devices relies on the deposition of thin, even films of desired chemical composition and structure. Deposition of thin, even films requires that the surface on which the film is to be deposited to be smooth and even. Otherwise, the deposited layer will not be smooth and even. One aspect of this property of film deposition is termed "surface sensitivity." {See Kwok et al., *J. Electrochem. Soc.*, 141(8):2172–2177 (1994); Matsuura et al., *Proceedings of the $22^d$ International Conference on Solid State Devices and Materials, Sendai*, pp:239–242 (1990); Fujino et al., *J. Electrochem. Soc.* 138(2):550–554 (1991); and Fujino et al., *J. Electrochem. Soc.* 139(6):1690–1692 (1992), each incorporated herein fully by reference.} Surface sensitivity is characterized by inconsistent and variable deposition rates and increased roughness of the resulting films as the process conditions are varied. The process conditions of interest are deposition temperature, deposition pressure, mole-fraction of the reactants (e.g., TEOS and ozone), and possibly some hardware conditions specific to the design of the reactor used to deposit these films.

An approach to decrease the surface sensitivity is to modify the surface of the underlying film. Maeda et al., U.S. Pat. No. 5,387,546 taught the exposure of deposited semiconductor films to ultraviolet radiation during heating. The ultraviolet radiation was produced by a mercury lamp which generates electromagnetic radiation with wavelengths of 185 nanometers (nm) and 254 nm, as well as some longer wavelength radiation. However, because this process is carried out on layers of USG film which have already been deposited, it does not deal with the problem of surface sensitivity. Thus, there is a need for improved ways of reducing surface sensitivity.

Additionally, with increasing miniaturization of semiconductor devices, as the gaps between device features decreases, these gaps becomes increasingly more difficult to fill adequately with dielectric material. Moreover, as the surface films increase in thickness, the corresponding film does not completely fill the gap, resulting in the formation of a "void." This is especially the case if there is surface sensitivity of deposition of materials within the gap. Films which provide a conformal coating of device features, result in the formation of voids as the gaps becomes filled. These voids can trap contaminants which can degrade the integrated circuit device, and are not effective dielectrics. Thus, there is a need for improved gap filling in the manufacture of semiconductor devices.

Additionally, as circuit feature density increases, there is a need for developing new dielectric materials. Such materials include organic polymers. Deposition of these polymers can be accomplished by dissociating precursors with reactive intermediates and permitting these intermediates to polymerize on the semiconductor substrate. To improve the physical and chemical properties of these deposited materials, dissociation of precursors can be accomplished using electromagnetic radiation in the ultraviolet and vacuum ultraviolet wavelengths. However, the currently available devices for such irradiation are not well suited to optimizing the exposure of substrates and films to ultraviolet radiation. The problems and attempted solutions to these problems are discussed in more details below.

B. Ultraviolet and Vacuum Ultraviolet Lamps

Lamps for producing ultraviolet or vacuum ultraviolet radiation are known in the art, and are exemplified by the devices described in Kogelschatz, U.S. Pat. No. 5,432,398; Kogelschatz, U.S. Pat. No. 5,386,170; Eliasson et al., U.S. Pat. No. 4,837,484; Eliasson et al., U.S. Pat. No. 4,945,290; Eliasson et al., U.S. Pat. No. 4,983,881; Gellert et al., U.S. Pat. No. 5,006,758; Kogelschatz et al., U.S. Pat. No. 5,198,717; and Kogelschatz, U.S. Pat. No. 5,214,344. Each of the aforementioned references in herein incorporated fully by reference.

Dielectric barrier discharge devices consist of two conductive electrodes, at least one of which is covered with a dielectric layer and are separated from each other by an emitter moiety-containing gap. Emitter moieties are usually in the form of a gas, whose atoms, under normal temperatures and other pressures, do not form chemical bonds between them. For example, at usual temperatures and pressures, noble gases normally do not form interatomic bonds. However, under high energy conditions, such as those present in plasmas, the emitter moieties lose electrons, and therefore the moieties can form intra-atomic bonds, thereby forming "excited emitter moieties." "Excited emitter moieties" as herein defined comprise at least two emitter moieties bonded to each other under conditions of radiator operation. These bonds have high energy and are unstable, and upon their breakdown, electromagnetic radiation of wavelengths characteristic of the excited emitter moiety is emitted.

The high energy plasma used to form the excited emitter moieties is generated by dielectric discharge, which is generated when an electrical field is created between electrodes with high resistance to electric current flow between them. Electrodes are coated with a dielectric material which provides the large resistance to the flow of electrical current between the electrodes and have a high capacitance. Thus, a high voltage is required to overcome the dielectric barrier, and when the voltage is sufficiently high, the barrier is overcome, and a plasma is generated in the gas between the electrodes. Because a higher voltage is needed to initiate plasma formation between dielectric barrier electrodes, the resulting current through the gas is substantially higher than between electrodes without the dielectric layer, and consequently, more power is delivered to the gas.

C. Problems in the Art

The prior art devices, however, suffer from several problems which make them less desirable for use for the exacting needs of semiconductor manufacture. These include uneven temperature distribution within the device, uneven radiation distribution over the surface to be treated, and short useful lifetime.

1. Generation of Uneven Plasmas

The first problem is that for each plasma microfilament generated between electrodes, the dielectric barrier is overcome at only a few sites along the electrode's surface. Once a site of plasma microfilament formation has been established, the dielectric material at that site can be degraded, thereby decreasing its resistance to electrical current. As the resistance decreases, that site becomes the focus for subsequent discharges. Repeated discharges further exacerbate the dielectric degradation and results in locally high temperatures within the dielectric material. This leads to further degradation of the properties of the dielectric. As the dielectric material becomes degraded, it loses the ability to store charge, the threshold voltage for dielectric discharge decreases, resulting in progressive loss of electrical power and weakening of the plasma field. Because the power output of the excimer device is related to the power of the electrical discharge, loss of electric power results in decreased radiation output from the device. Thus, the useful lifetime of the excimer device is limited.

2. Temperature Regulation

Another problem is that during use, the electrodes and emitter gas can be overheated. Overheating the electrodes alters the wavelength of the emitted radiation and can lead to degradation of the electrode dielectric material, reducing the useful lifetime of the lamp. Although the exact mechanism of this overheating is not known, it is known that plasma microfilaments are not evenly distributed in the discharge spaces of the prior art devices. This uneven distribution of plasma results in variations of gas temperature in different parts of the devices.

As a result of temperature differences within the discharge tube, there are differences in the wavelengths of the emitted radiation generated by the lamp. This results in a broader spectrum of emitted radiation, which can have undesired consequences on semiconductor processing. When working with precursor materials for film deposition, the energy required to dissociate a particular type of chemical bond is narrow. Controlled processing of these precursor molecules requires the precise control of the energy of the radiation used to dissociate the desired bonds.

However, broadening the spectrum of radiation can break bonds within the semiconductor material which are not intended to be broken, leading to a heterogeneous mixture of precursor molecules, some of which are not desired and actually contaminates the film to be deposited. Furthermore, exposing a surface to broadened spectrum of radiation can lead to degradation of the semiconductor surface or formation of undesired species of radicals. For example, in the case of Xe, when the temperature of the excimer gas exceeds about 300° C., the interatomic bonds between xenon atoms do not form. Thus, without interatomic bonds to breakdown, there is no excimer radiation emitted by the device.

Thus, a significant problem in the art is how to overcome these differences in temperatures locally within the devices, and how to keep the emitters cool enough to efficiently generate UV or VUV radiation. Prior art devices have incorporated water to both cool the devices and provide more even temperatures. However, because water has a very high dielectric constant (K=81), water conducts electrical fields easily, thereby providing an alternative pathway for electrical energy to flow away from the excimer gas. This leakage of current to electrical ground requires a much higher power output from the AC source to generate the needed electrical power to the gas to initiate and maintain lamp operation.

3. Uneven Distribution of Radiation

Another problem specific to the manufacture of semiconductor devices is the desirability of providing even distribution of the radiation onto the surface of a semiconductor wafer. Several of the prior devices consist of tubes in which a central electrode is surrounded by an outer electrode. Examples of such devices are found in Kogelschatz, U.S. Pat. No. 5,013,959, Kogelschatz, U.S. Pat. No. 5,386,170, Kogelschatz, U.S. Pat. No. 5,432,398, and Kogelschatz et al., U.S. Pat. No. 5,198,717. Each of these patents is herein incorporated fully by reference. Because the discharge tubes of these devices emit radiation radially in all directions, they do not provide even emission of radiation in a particular desired direction. This is because the intensity of the radiation is altered by its passing through the elements of the device, such as quartz tubes, electrodes, and by passing through the emitter gas itself. The electromagnetic power not reaching the wafer is therefore wasted. Additionally, the geometry of cylindrical emitters with a central electrode surrounded by the electrode inherently produces uneven radiation. Uneven distribution of radiation results in uneven exposure of the flat wafer, thereby resulting in uneven treatment of the surface, thereby reducing the precision and consistency of the exposure of a semiconductor wafer to the radiation.

Attempts in the prior art to overcome uneven distribution include devices such as those exemplified by Gellert et al., U.S. Pat. No. 5,006,758, Eliasson et al., U.S. Pat. No. 4,983,881, Eliasson et al., U.S. Pat. No. 5,173,638, and Eliasson et al., U.S. Pat. No. 4,945,290. Each of the above patents is herein incorporated fully be reference. These devices suffer from the same problem of localized loss of dielectric efficacy and uneven plasma generation. Additionally, with many of the prior art devices, there is no means for cooling the electrodes, and further degradation of the dielectric material and heating of the excimer gas results in inefficiency and short useful device lifetime.

4. Contamination of Radiators

An additional problem in the art is that with use, excimer lamps become contaminated with by-products of the impurities within the excimer gas, and from the dielectric material. These contaminants deposit on the window of the lamp, thereby decreasing its transparency to the UV or VUV radiation. This contamination reduces the useful lifetime of the device.

Thus, there are persistent problems in the art to design and manufacture excimer devices which remain cool during use, have long useful lifetimes, have narrow spectra in the desired wavelength ranges, have even distribution of intensity of the emitted radiation and are convenient and relatively inexpensive to manufacture.

SUMMARY OF THE INVENTION

Thus, one object of the invention is the design of excimer lamps which provide even distribution of emitted radiation, suitable for semiconductor manufacture and processing.

Another object of the invention is the design of excimer lamps which have long useful lifetimes.

A further object of the invention in the design of excimer lamps is miniaturization.

Another object of the invention is the design of excimer lamps which retain their efficiency under conditions of increased power output.

Yet another object of the invention is the design of excimer lamps which are easy to decontaminate during operation.

A further object of the invention is the design of excimer lamps wherein the contamination is confined to areas which will not affect the radiation intensity or wavelength.

To address these problems, this invention provides excimer lamps which comprise arrays of electrodes in a plane, the electrodes being individually cooled and having means to distribute the plasma discharges along the length of each electrode.

Therefore, one aspect of the invention comprises a design for a conductive electrode surrounded by a dielectric material with grooves in the dielectric material to distribute the plasma generating sites along the length of the electrode.

Another aspect of the invention comprises an array of electrodes imbedded within a dielectric layer, with depressions in the dielectric material to distribute the plasma generating sites over the dielectric layer.

Another aspect of the invention comprises an array of electrodes and radiator which are miniaturized to increase efficiency, decrease power consumption, and increase the evenness of distribution of emitted radiation.

A further aspect of the invention comprises an array of discharge tubes with electrodes between the tubes, wherein the radiation is easily transmitted through the walls of the tubes.

Yet another aspect of the invention comprises means for decontaminating the excimer gas while the gas is inside the radiator.

A further aspect of the invention comprises thin windows for transmission of radiation while maintaing sufficient mechanical strength to withstand high pressure gradients.

BRIEF DESCRIPTION OF THE DRAWINGS

FIG. 4 depicts an embodiment of the invention in which the electrodes are in contact with a cooling block which is cooled by cooling fluid circulated within the block.

FIG. 5b depicts details of the configuration comprising a cooling block, electrodes and gas discharge tubes of FIG. 5a.

FIG. 5c depicts the construction of one embodiment of a plate electrode of FIG. 5a.

FIG. 6a depicts an alternative embodiment of the invention in which the electrodes are wire or spiral wire within an electrode cooling space.

FIG. 6b depicts details of the construction of an electrode as shown in FIG. 6a, having a spiral conductive element.

FIG. 6c depicts an alternative embodiment in which the cooling of the electrodes is primarily by the interior electrode cooling space.

FIG. 7a depicts an embodiment of the invention in which the discharge spaces are defined by a hemi-cylindrical element and a transparent window, with cooling fluid circulating around each electrode.

FIG. 7b depicts an embodiment of the invention in which the electrodes are in contact with cooling fluid dctly, and are imbedded in dielectric material and are outside the plane of the discharge space, and in which details of window construction are shown.

FIG. 7c depicts an embodiment in which thin electrodes are imbedded in dielectric material and are outside the discharge space.

FIG. 7d is a top view depicting an embodiment shown in FIGS. 7b or 7c, showing the relationship between spherical spacers and underlying electrodes.

Figure 1A:
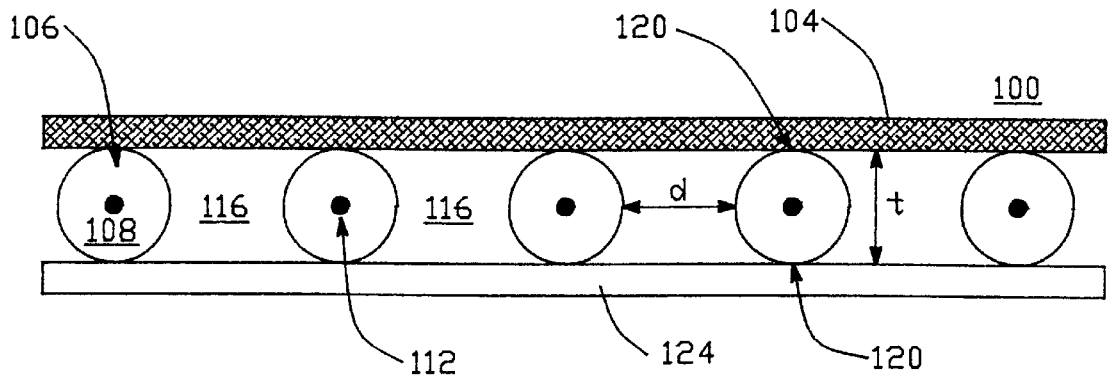
FIG. 1a depicts an embodiment of an array of electrodes wherein the electrodes are in contact with a cooling block and a transparent window. Electrodes are viewed in cross-section.
Figure 1B:
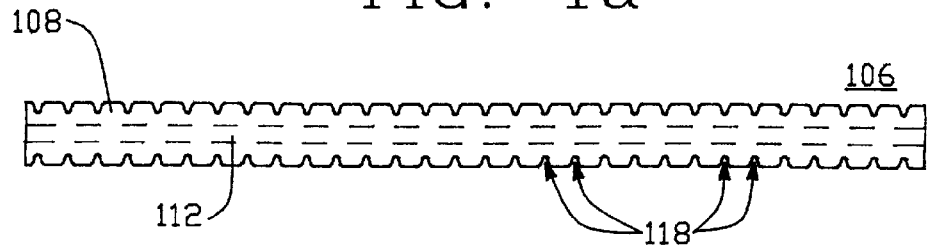
FIG. 1b depicts a top view of an electrode of FIG. 1a with grooves for distributing plasma discharges along the length of the electrode.
Figure 1C:
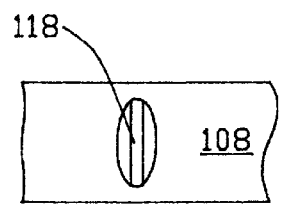
FIG. 1c is a side view of an electrode depicted in FIG. 1b showing the orientation of grooves in the dielectric layer.

The Figures are more fully explained in the Detailed Description of the Invention.

DETAILED DESCRIPTION OF THE INVENTION

The present invention comprises apparatus for treating semiconductor substrates with electromagnetic radiation of the ultraviolet (UV) and vacuum ultraviolet (VUV) wavelengths. This treatment can occur either before or after deposition of a semiconductor device layer, such as metal lines or dielectric layers.

I. Dielectric Barrier Discharge Lamps

Dielectric barrier discharge lamps (also known as silent discharge lamps) incorporating novel electrode design, novel discharge tubes, novel electrode configurations, and novel cooling means form the basis of the devices of this invention. These devices produce radiation by fluorescent emission mechanisms and by excimer processes, depending upon the type(s) of moieties present within the discharge tube. Depending on what the emitter gas is, the wavelength of the emitted radiation may be in the ultraviolet or vacuum ultraviolet range. VUV and UV radiation can be generated from noble gases and other atomic species (see Table 1).

TABLE 1

| Emission Wavelengths For Selected Electromagnetic Radiation Emitters | |
|---|---|
| Emitter Moiety | Wavelength (nanometers) |
| $He_2$ | 60–100 |
| $Ne_2$ | 80–90 |
| $Ar_2$ | 107–165 |
| $Kr_2$ | 140–160 |
| $Xe_2$ | 160–190 |
| $N_2$ | 337–415 |
| KrF | 240–255 |
| Hg/Ar | 235 |
| Deuterium | 150–250 |
| XeF | 340–360, 400–550 |
| XeCl | 300–320 |
| XeI | 240–260 |
| ArF | 180–200 |
| ArCl | 165–190 |
| ArCl/KrCl | 165–190, 200–240 |

TABLE 1-continued

Emission Wavelengths For
Selected Electromagnetic Radiation Emitters

| Emitter Moiety | Wavelength (nanometers) |
|---|---|
| KrCl | 200–240 |
| Hg | 185, 254, 320–370, 390–420 |
| Se | 196, 204, 206 |

Data from Eliasson et al., U.S. Pat. No. 4,983,881 and Kogelschatz, U.S. Pat. No. 5,432,398, incorporated herein fully by reference.

These ranges of wavelengths encompass the wavelengths equivalent to the energy of the chemical bonds of the precursors for film deposition, those present in the deposited films, or those present as undesired contaminants on the substrate surface. Some of the chemical bonds commonly associated with semiconductor manufacturing and processing are given in Table 2 below and correspond to energies in the UV and VW ranges.

According to some theories, surface modification requires the breaking of undesirable bonds and/or the formation of desirable surface bonds or surface sites. These bonds include Si—OH, Si—C and Si—N, among others. The bond energies of some relevant bonds are shown in Table 2. These energies lie in the visible, ultraviolet (UV) and vacuum ultraviolet (VUV) range, and therefore electromagnetic radiation of these wavelengths will interact with these bonds. Therefore, it is possible to modify the bonding states of the thermal oxide or other underlying materials such as insulators, metal conductors, or barrier layers by exposing this surface to UV or VWV radiation.

TABLE 2

Bond Energies For Selected Bonds

| Bond | Energy (eV) | Wavelength (nm) |
|---|---|---|
| H—H | 4.52 | 274 |
| C—C | 3.60 | 344 |
| Si—Si | 1.83 | 678 |
| N—N | 1.67 | 745 |
| O—O | 1.44 | 861 |
| C—H | 4.28 | 289 |
| Si—H | 3.05 | 406 |
| N—H | 4.05 | 306 |
| O—H | 4.80 | 259 |
| C—Si | 3.01 | 413 |
| C—N | 3.02 | 410 |
| C—O | 3.64 | 340 |
| Si—O | 3.82 | 324 |
| C═C | 6.34 | 195 |
| C≡C | 9.22 | 134 |

Data from L. Pauling, *The Nature of the Chemical Bond and the Structure of Molecules and Crystals: An Introduction to Modern Structural Chemistry*, Third Edition, Cornell University Press, Ithaca, N.Y., 1960; and Atkins, *Physical Chemistry*, 3d Edition, Oxford University Press (1988), incorporated herein fully by reference.

As can be seen from Table 2, certain bonds can absorb electromagnetic radiation and thereby be disrupted. The electromagnetic radiation of the lamps of this invention have sufficient energy to break the bonds, thereby allowing removal of the moieties from the surface. {For example, Khan et al., Ser. No. 08/986,916, titled Processes for Surface Modification of Semiconductors Using Electromagnetic Radiation discloses methods for reducing the surface sensitivity of semiconductor wafers to the subsequent deposition of tetraethylorthosilicate/ozone films, incorporated herein fully by reference.}

Although the wavelengths shown in Table 1 are those exhibiting the maximum power, there is a bandwidth of the wavelengths generated by each of the above emitter moieties. The bandwidths vary from about 1 to about 17 nm. {Newman et al., Aust. J. Phys. 48:543–556 (1995), incorporated herein fully by reference.} Thus, these emitters can be used to expose the surface of a semiconductor substrate to a spectrum of electromagnetic radiation, thereby increasing the number and types of chemical bonds which may be dissociated.

A. Electrode Design

The problem of uneven plasma formation with the device is minimized by the use of a novel round-contoured grooves or alternatively, dimples, ovals, cylinders or other shaped depressions in the surfaces of the dielectric-coated electrodes, and by minimizing the size of the electrodes (for cylindrical electrodes, for example, see FIG. 1a). The electrodes can have a diameter of from about 20 μm to about 20 mm, preferably from about 20 μm to about 10 mm, and more preferably from about 100 μm to about 3 mm. The grooves or depressions are cut into the dielectric material to a depth of from about ¼ of the electrode radius to about ½ of the electrode radius and are oriented perpendicularly to the plane of the electrode array (for example, see FIGS. 3b and 3c). The depressions are sites of formation of plasma microfilaments. By providing many such sites of plasma microfilament formation, there is a decreased tendency for the plasma to be progressively formed at only a few sites in the discharge space. Consequently, the power will be more evenly distributed within the radiator and the emitted radiation will be more uniform.

The depressions provide areas of increased capacitance between adjacent electrodes. These areas then become the sites of formation of plasma filaments.

The depressions can be spaced along the electrode at any convenient distance, by way of example only, of about 20 μm to about 10 mm with more depressions or grooves providing more sites of plasma formation. Thus, more closely spaced depressions are preferred, for example, about 20 μm to about 5 mm. In general, the spacing of depressions is preferably no smaller than the radius of curvature (r) of the electrode. Thus, for thinner electrodes, the depressions can be spaced closer together than for wider electrodes.

Moreover, deeper depressions increase capacitance more than shallower depressions. The depressions or grooves should be deep enough to initiate plasma discharge. However, deeper depressions have to be wider than shallower ones. The depth of the depression should be shallow enough to avoid direct electrical breakdown of the dielectric material. The preferred depths of the depressions are in the range of from about 0.1 to about 0.9 times the thickness of the dielectric material covering the conductive element of the electrode. The pitch of a depression is herein defined as the ratio of dimensions of the depression, approximated by the deepest depth of the depression divided by its width at the surface of the electrode. In general, the depressions are preferably not less than the cross section diameter of the micro-discharge channel (from about 10 μm to about 100 μm in diameter). Therefore, shallower depressions can be spaced more closely together.

The exact shapes and dimensions of the depressions can vary, but depressions are preferred which have no sharp corners or edges which would concentrate the charge and initiate plasma formation at undesired locations (FIGS.

1c–1d). Depression features are preferred in which the radius of the feature is in the range of from about 0.1r to about 0.3r, where r is the radius of the electrode.

In alternative electrode design, including, by way of example, electrodes imbedded within a dielectric material (see FIGS. 7b and 7c), the depressions can be made in the overlying dielectric layer. Depressions can be as grooves, dimples, ovals, or cylindrical shaped structures as desired. For grooves, their orientation can be in a matrix array, perpendicular to the electrodes, or it can be parallel to the electrodes. For dimples, their location is preferably over the conductive elements. However, other orientations of depressions are contemplated and are within the scope of this invention.

B. Electrode Configuration and Lamp Design

Figure 1D:
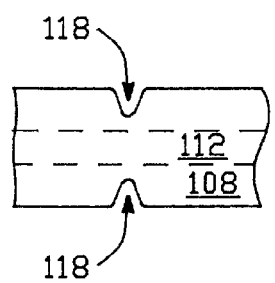
FIG. 1d depicts an embodiment of a groove of FIG. 1b with curved contours.
Figure 1E:
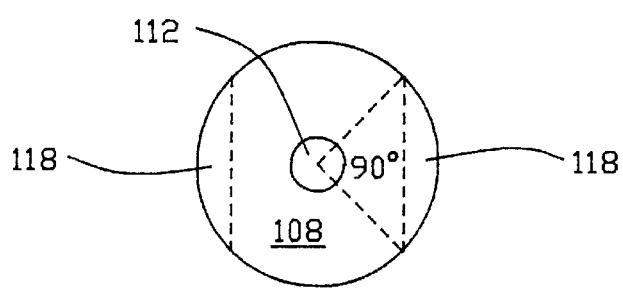
FIG. 1e is a cross-sectional view of an electrode of FIG. 1b depicting the orientation of a groove and its dimensions relative to the electrode.
Figure 2:
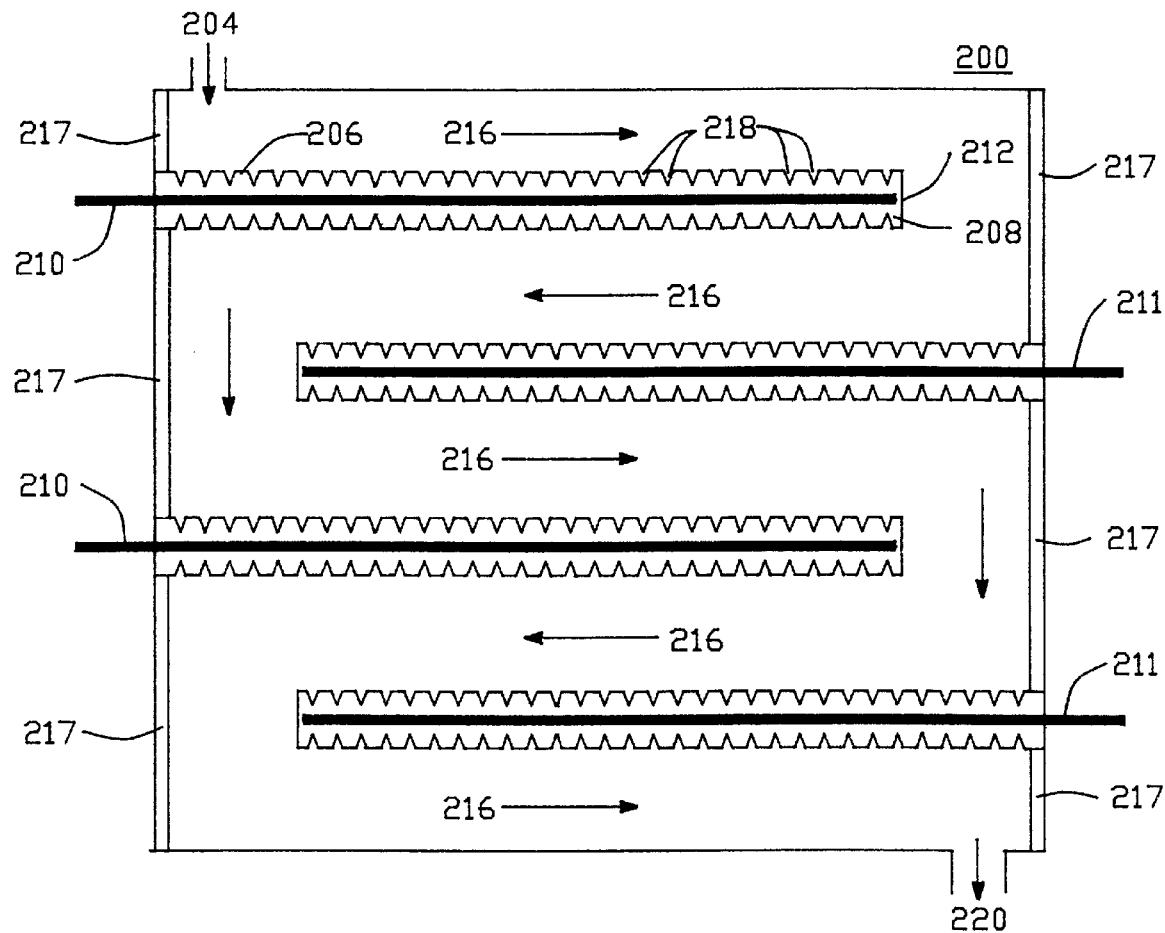
FIG. 2 depicts an embodiment of the invention in which the flow of emitter gas is parallel to the electrodes, and in which a getter device is used to de-contaminate the gas.

In one embodiment of this invention, electrodes can be used which preferably comprise a thin conductive element such as, by way of example only, tantalum wire, surrounded by a layer of dielectric material, by way of example only, such as quartz or ceramic (FIG. 1a). This type of construction provides long, thin electrodes which can be arranged preferably in parallel, thereby providing a planar electrode array which is thinner than devices currently available (FIG. 2). When placed within a discharge space containing an emitter gas, the dimensions of the discharge space can be as narrow as the electrode (see FIG. 1). Typical electrode diameters (t) are in the range of from about 20 $\mu$m to about 20 mm, preferably from about 100 $\mu$m to about 5 mm, and more preferably from about 1 mm to about 3 mm. In this electrode configuration, the emitter gas is between the electrodes and is contained within a discharge space bounded at one surface by a window that is transparent to the wavelengths of radiation generated.

In alternative embodiments, the discharge tubes are small (about 100 $\mu$m–10 mm in diameter) are arranged in a planar array with electrodes between them. The cross-sectional shape of the discharge tubes can vary, being rectangular (FIGS. 5a–5d, FIGS. 6a and 6c), circular, semi-circular (FIG. 7a), or any other desired shape. In this type of configuration, the electrodes need not be encased in layers of separate dielectric material. The discharge tube itself can be a sufficient dielectric material with sufficient resistance to permit the high power plasmas to be generated within the discharge tubes.

In yet other embodiments, the electrodes are imbedded within a dielectric layer with a surface delimiting one side of the discharge space, with the discharge space being located above the plane of the electrodes (see, for example, FIGS. 7b and 7c). The thickness of the dielectric layer is chosen to provide sufficient dielectric breakdown voltage to initiate plasma microfilament formation and excitation of the emitter gas within the discharge space.

The overall shapes of the lamps can vary, depending on the length and shape of the space between electrodes. Circular, rectangular, ovate, triangular, or other desired shaped lamps can be made by adjusting the relative lengths and positions of the electrodes in the array.

The electrodes are connected to a source of alternating electrical current to generate the plasmas. Such electrical devices are well known in the art and will not be described further. The voltages necessary to initiate plasma discharge across the gap between electrodes are in the range of about 1 kV/cm to about 50 kV/cm, preferably between about 10 kV/cm and about 40 kV/cm, and for electrodes 1.2 mm in diameter, the working voltage across the gap will be less than about 10 kV. Further miniaturization of the electrodes and closer spacing can decrease the required voltage to below 5 kV, and can be as low as, by way of example only, to about 300 V for certain gases.

The window or discharge tubes must be transparent to the radiation emitted. For UV radiation, the windows may be made, by way of example only, of quartz, preferably single crystal quartz or ceramic, and for VUV radiation, the windows can be made, by way of example only, of LiF, $MgF_2$, $CaF_2$, synthetic quartz, or sapphire.

Moreover, the pressure within discharge space is usually below atmospheric pressure for VUV devices. This is because the VUV radiation can be absorbed by the gas, thereby decreasing the transmission of the VUV radiation to the exterior of the device. The pressure within the discharge space can also be below the pressure outside the discharge space, thus creating a pressure differential across the window, which can subject the window to large stress. The combination of reduced dimensions and reduced pressure requires the window of the devices to be strong enough to understand the differences in pressures between the interior of the discharge space and the exposure chamber in which the radiation is used. Therefore, this invention can incorporate means for supporting the window to maintain integrity in view of a relatively large pressure difference across the device.

Furthermore, the sides of the discharge spaces opposite the window can be coated with a suitable reflective material such as, by way of example only, $MgF_2$.

Additionally, novel shapes of the discharge tubs can be used, such as by way of example only, cylindrical or rectangular cross sections, thus eliminating the need for a separate window. By placing electrodes between discharge tubes, radiation generated within the tube can exit the tube and thereby expose the surface to be treated. For devices requiring larger discharge spaces, windows can be supported by the electrodes themselves or by ceramic supports.

C. Minimizing Lamp Contamination

Sealed lamps become contaminated with impurities from the gas or from the window materials. This contamination decreases transmission of radiation through the windows or discharge tubes. To solve this problem, the lamps of this invention use a flow-through system for continually exchanging the emitter gas within the discharge spaces and tubes.

It is known that plasmas can become unstable if the flow of gas is not parallel to the direction of the plasma. Unstable plasmas generate uneven discharge intensity. Therefore, in certain embodiments of this invention using a flow-through system, the flow of the emitter gas is oriented perpendicular to the electrodes, thus ensuring that the gas flow is parallel to the orientation of the plasma microfilaments. This orientation of gas flow parallel to the plasma microfilaments ensures that the intensity of the emitted radiation is even, thus permitting more accurate regulation of the surface treatment. In some embodiments incorporating a flow-through of emitter gas, wherein the flow of gas is parallel to the electrodes, and thus perpendicular to the plasma microfilaments, the plasma instability associated with this orientation of gas flow and plasma orientation can be minimized by using low gas flow rates.

In other embodiments, the emitter gas can be decontaminated while within the lamp by the use of getters. Getters can trap ionic or radical moieties, and thereby decontaminate the stream of emitter gas. The getters are preferably located at the periphery of the array of electrode. See FIG. 2.

The problem of contamination can also be solved by exhausting the emitter gas from the lamp into an external filter, where the gas can be decontaminated and thereafter re-used. Alternatively, fresh, unused gas can be introduced into the lamps.

D. Cooling

Because of the high power requirements of dielectric discharge lamps, it is important to be able to carefully regulate the temperature of the devices. This is accomplished by miniaturizing the lamps to reduce power and by incorporating novel cooling means into the lamps.

Miniaturization promotes more even temperature distribution by permitting transfer of heat through thermally conductive elements over shorter distances. Moreover, miniaturization permits more efficient use of power to the device, thus reducing the total power dissipated within the device. Thus, less heat is produced, and along with the use of novel cooling means, the miniaturization permits operation of the lamps of this invention at lower temperatures.

Alternatively, the electrodes can be mounted on a thermally conductive material such as, by way of example only, beryllium oxide, aluminum nitride or Kerafoil™, a trademark of the MHNW International Corporation's (Mahwah, N.J.) ceramic heat-conductive film. Other suitable thermally conductive materials known in the art can also be used in this invention. Suitable ceramic materials conduct heat rapidly, and can therefore draw away excess heat generated by the electrodes. For this to occur efficiently, the electrodes must be in close contact with the thermally conductive ceramic material. Moreover, electrodes, dielectric material, and the ceramic support preferentially have similar thermal conductivity and coefficients of thermal expansion. Tantalum wire and quartz have similar coefficients of thermal expansion, and thus are among preferred materials for electrode construction. This ensures that with use, the electrodes and support elements remain in close contact with each other, so that any increases in electrode temperature do not result in decreased heat loss through differential expansion creating gaps between electrode and the cooling block.

In addition to this conductive cooling means, this invention also can also rely on devices using the reverse Peltier effect for removing excess heat from the thermally conductive material. Devices incorporating the reverse Peltier effect are well known in the art and are available commercially. By way of example only, TechniCOOL™, a trademark for Melcor's (Trenton, N.J.) solid state thermoelectric cooling device is suitable.

Alternatively, radiators can incorporate liquid cooling means to remove excess heat. See FIGS. 3–7. Such means include the formation of bores within the cooling blocks and a pump to circulate coolant to a radiator to remove excess heat. For certain applications, the cooling fluid may be water, but for other applications requiring electrical isolation of the cooling means from the electrodes, fluids with low dielectric constants can be used. These include glycol or Halon™ based glycol.

The degree of cooling will depend on the power consumption and output of the radiator. Increasing the power output of the radiator requires more efficient cooling to maintain the radiator temperature within a desired operating range. The temperature of the excimer moieties should be sufficiently low to permit intra-atomic bonding during radiator operation. For example, when Xe is used an as excimer moiety, the maximum operating temperature should be below about 300° C.

All of these aspects of the invention permit careful control of the distribution of radiation intensity, decreases in the power requirements for the lamps, and thereby permit more exacting exposure of semiconductor materials to the radiation. These improvements are useful for the manufacture and processing of semiconductor materials.

II. Uses of UV and VUV Lamps

A. Pre-Treatment of Semiconductor Substrates

Pre-treatment of semiconductor substrates with UV or VUV radiation reduces contaminants on the semiconductor material, and thereby provides a more ideal surface upon which to deposit subsequent layers of semiconductor materials. For example, if the semiconductor surface is rough, subsequent layers of semiconductor materials may not deposit evenly on the surface, and can result in variations of film thickness or dielectric constant. This variation of film deposition depending on the underlying substrate is termed surface sensitivity. Surface roughness or voids in film deposition can result from the presence of contamination by organic materials, water, or other undesired materials. Treatment with UV or VUV radiation can decrease surface sensitivity by removing contaminants which are responsible for the phenomenon.

For example, a thermally oxidized semiconductor surface is expected to have Si—O—Si, Si—H, and Si—OH bonds on the surface along with some hydrocarbon or other organic contaminants. According to one theory, the presence of these types of bonds decreases the homogeneity of the resulting deposited film, thereby causing it to have a rough surface. According to this theory, these bonds may form when contaminants on the surface bind to the silicon or oxygen atoms in the $SiO_2$ film.

Another theory relates to the presence of organic contaminants on the substrate surface. Typical sources of organic contamination are clean room air and the photoresist residue from photolithography processes. The organic moieties found include silicon carbide, amides, silicones, organophosphorous compounds, $C_6$–$C_{28}$ aliphatic or aromatic hydrocarbons, phthalates, alcohols (e.g., isopropyl alcohol), N-methyl pyrrolidone, creosols and amines. Camenzind et al., *Balazs News*, Number 20: 1–3 (October 1997); and Camenzind et al., MICRO pp: 71–76 (October 1995), incorporated herein fully by reference.

These theories are included only for descriptive purposes, and the present invention does not rely upon any particular of these theories for its operability. Regardless of the molecular source or mechanism responsible for the modifications of semiconductor surfaces by UV and VUV radiation, the present invention discloses improved excimer devices for processing semiconductor surfaces.

III. Deposition of Dielectric Films and In-Film Processing of Substrate Materials In addition to pre-treating semiconductor surfaces, UV and VUV radiation is useful for initiating chemical reactions involved in semiconductor manufacture. For example, Lee et al., U.S. application Ser. No. 08/958,057, incorporated herein fully by reference, discloses the use of VUV and UV radiation for selectively breaking bonds within precursor molecules thereby generating reactive intermediates which can polymerize to form low dielectric films with improved thermal and mechanical stability on the semiconductor surface.

Moreover, treatment of deposited semiconductor films with electromagnetic radiation also can be used to break certain bonds within the film itself, thereby promoting cross-linlding or other desired chemical reactions within the material. Such chemical reactions can increase the thermal and mechanical stability of the material, and also can result in altering dielectric properties of the material.

EXAMPLES

The following examples illustrate some of the features of this invention. Other embodiments are possible, and are all considered part of the invention.

Example 1

Example 1 shows a schematic diagram (FIG. 1a) of a device 100 according to the instant invention. Device 100 includes a planar layer of thermally conductive ceramic material 104 and a plurality of electrodes 106 comprising a central conductive element 112 made of any suitable material, including, by way of example only, tantalum, surrounded by a dielectric material 108 manufactured from, for example, quartz or other suitable material. The conductive elements 112 and the dielectric material 108 are chosen to have compatible coefficients of thermal expansion, so that during use, as the electrodes 106 warm, no gaps or undue stresses are created within the electrodes. This increases the useful lifetime of the electrodes. Tantalum and quartz have similar coefficients of thermal expansion, and are therefore preferred. However, other pairs of conductive elements and dielectric materials with high thermal conductivity and similar coefficients of thermal expansion are suitable. Thermally conductive ceramic 104 can be any suitable material, with preferred materials including beryllium oxide and aluminum nitride.

The electrodes 106 can be manufactured from conductive elements 112 and a dielectric tube 108 having a central bore of slightly smaller diameter than the conductive element 112. Upon sufficient heating, the dielectric tube 108 expands, increasing the diameter of the central bore to accommodate the conductive element 112. After inserting the conductive element 112, the electrode is cooled, and the dielectric contracts to form a close contact with conductive element 112. Care should be taken to prevent stresses upon the electrode which would weaken it or could form fractures which would degrade the dielectric properties of the material 108.

The electrodes 106 should have an outside diameter of from about 20 $\mu$m to about 20 mm, preferably about 100 $\mu$m to about 5 mm and more preferably from about 1 mm to about 3 mm. The electrodes 106 are welded to the ceramic or quartz material 104 using any suitable, thermally conductive method so that heat generated within the electrodes can dissipate easily into the material 104 and thereafter further dissipated from the device. Such welding methods include, for example, glass flits, stitching, ceramic glues or thermal compression methods known in the art.

The electrodes 106 are spaced closely and evenly, thereby defining a plurality of discharge spaces 116 about 100 $\mu$m to about 1 mm wide, which contain any suitable gas or mixture of gases. The gases may be emitter gases or may be a combination of emitter gases and carrier gases such as nitrogen. It is important that the gases chosen not excessively absorb the desired wavelengths of emitted radiation. However, using certain gases to selectively absorb undesired wavelengths of radiation can increase the selectivity of output of the excimer lamp. The gases and their absorption spectra are well known in the art.

The gas pressures within the discharge spaces 116 can be sub-atmospheric, atmospheric, or greater than atmospheric pressure. By providing more emitter gas, the intensity of the radiation can be increased. However, the VUV path length through a gas decreases with increased pressure due to increased absorption by denser gas which exists at higher pressures. Therefore preferred pressures are in the range of about 10 milliTorr to about 100 Torr, and more preferably about 10 milliTorr, a pressure at which the path length of VUV radiation is about 1 cm.

The electrodes 106 are welded to a window 124 using similar methods as described above. The welds between electrodes 106 and window 124 are capable of dissipating generated heat, as well as is the conductive ceramic 104 subserves that purpose. The window 124 is made of any material transparent to the wavelength of radiation desired. In general, the intensity of transmitted radiation through a window is expressed by the following relationship:

$$I = I° e^{-\alpha x}$$

where I is the measured intensity of radiation after the light passes through the window, I° is the initial intensity of the radiation before passing through the window, e is the base of the Napierian logarithms, $\alpha$ is the coefficient of transmittance of the window, and x is the window thickness. In general, it is preferable if the ratio I/I° is from about 80% to about 90% to maximize the efficiency of the emission of radiation.

For example, for UV wavelengths, quartz crystals are suitable, preferably those made of single crystals. For shorter wavelengths such as those of WV, highly purified quartz crystals, LiF, $MgF_2$, or $CaF_2$ are used, preferably single crystals of those materials. LiF is preferred, as this material is about 80%–90% transparent to wavelengths as short as about 110 nm. $MgF_2$ is also suitable for uses in which the wavelength is no shorter than about 120 nm, as $MgF_2$ transmits about 80% to about 90% of wavelengths longer than about 120 nm. For longer wavelengths, fused quartz or sapphire crystals are suitable. The window 124 should be as thin as possible while being sufficiently strong to maintain the pressure differential between the discharge space 116 and the outside of the emitter device.

The thickness (t) of the discharge space 116 and the electrodes 106 should be from about 20 $\mu$m to about 10 mm, preferably about 100 $\mu$m to about 5 mm, and more preferably about 1 mm to about 3 mm. However, the dimensions of the electrodes and discharge space can be chosen to optimize the emission of radiation. With larger diameter electrodes 106, there can be more gas molecules, which can therefore emit more radiation for a given gas pressure. Alternatively, with a thinner discharge space 116 in the t dimension, and a higher gas pressure, the same amount of radiation can be generated.

Alternating electrical power is applied to the electrodes in pairs, with adjacent electrodes being subjected to one pole of the AC source, and the adjacent member being exposed to the other pole. Alternating current frequencies can vary from about 5 Hz to about 1000 kHz, preferably from about 10 kHz to about 200 kHz, and more preferably about 20 kHz. The voltage across the electrodes can be in the range of about 300 V to about 20 kV, with preferred voltages of about 3 kV to about 8 kV, and more preferred voltages of about 5 kV. These lower voltages are possible if the distances between the electrodes are kept low and the gas pressure in the discharge space are in the range of about 10 milliTorr.

The power and exposure times are selected to provide the desired effect. For minimizing surface sensitivity to the deposition of undoped silicate glass (USG), the power output of the excimer lamps is in the range of from about 15 milliWatts/$cm^2$ to about 100 W/$cm^2$. Preferably, the power output is in the range of from about 15 milliWatts/$cm^2$ to about 50 Watts/$cm^2$, and more preferably about 1 Watt/$cm^2$.

Exposure times can vary inversely with the power output of the generator. However, these exposure guidelines can be altered depending upon the pre-existing state of the surface. For some surfaces, less power and/or shorter exposure durations are necessary.

To distribute the sites of generation of plasma microfilaments within the excimer device, the electrodes 106 are made with grooves 118 (FIG. 1b–FIG. 1e) in the dielectric 108. The grooves 118 can be triangular in cross section (FIG. 1b) or can have a rounded inner portion (FIG. 1d). Preferably, the grooves will have no sharp edges or corners. Generally, the axes of the grooves 118 are perpendicular to the axis of the conductive element 112 (FIG. 2c). The grooves are also arranged with their axes perpendicular to the axis of the electrode array. Thus, the grooves will have their interior surfaces facing the adjacent electrodes. Generally, the grooves are of sufficient depth to result in a subtended angle between the ends of the groove and the center of conductive element 112 of about 90°. However, variations in the groove depth and length can be made without departing from the invention.

The grooves distribute the sites of plasma microfilament formation and thereby increase the useful lifetime of the electrode. They also distribute the radiation more evenly. By creating areas of increased capacitance within them, the grooves promote formation of plasma discharges in the grooves and thereby prevent a more localized discharge pattern restricted to only a few sites along the electrode, as is the case with prior art devices. By distributing the discharge to more locations along the electrode, the flux of electrical current at each discharge site is decreased, resulting in more evenly distributed local heating of the electrode, and thereby minimizing the heat-induced degradation of the ceramic 108. This in only one possible theory of the beneficial role of the grooves 118. Other theories may account for the beneficial effect, and they all are included within the scope of this invention.

Alternatively, grooves 118 can be replaced by other shapes, including by not limited to dimples, ovals, cylinders and be within the spirit of the invention.

FIG. 2 shows an embodiment of the invention incorporating the grooved electrodes as shown and described above in FIG. 1. In this array, an array of electrodes is part of an excimer device 200 with adjacent electrodes 206 being connected alternatively to the opposite sides of the device 200. One set of leads 210 is connected to one side of an AC source (not shown), and the leads 211 are connected to the other side of the AC source.

The device 200 has an inlet port 204 for the introduction of gas mixtures, and has an outlet port 220 for the exhaustion of gases. Getters 217 are incorporated into the walls of the lamp to permit decontamination of the emitter gas as it passes through the device. The getters are made of titanium or any other suitable material known in the art. The getters 217 can be in the form of flat sheets or of mesh. The getters 217 are activated by the application of an electrical field to enhance attraction of contaminant ions.

The electrical fields can be generated using any suitable electrical source known in the art. Direct current voltages are in the range of from about 50 V to about 1000 V, and are preferably about 300 V.

In this configuration, the flow of gas is parallel to the electrodes (arrows), and is therefore perpendicular to the plasma microfilaments generated between adjacent electrodes. This configuration is easy to manufacture, because the electrodes are relatively simple in design. The dimensions of the device 200 are chosen to accommodate the size of the semiconductor wafer to be exposed to the radiation. Multiple electrodes can be incorporated into this configuration as required for the particular application.

Example 2

Figure 3A:
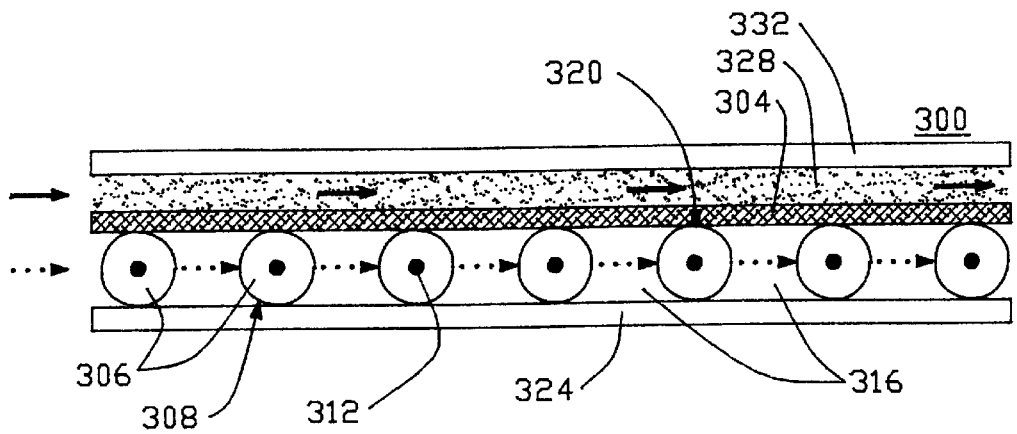
FIG. 3a depicts an embodiment of the invention in which electrodes are cooled by a cooling block and by a liquid medium. Electrodes are viewed in cross-section.

Another embodiment of the invention 300, depicted in FIG. 3a includes additional cooling means and a alternative pattern of emitter gas flow through the device 300. FIG. 3a shows a typical arrangement of elements in this embodiment. Electrodes 306 comprise an electrically conductive element 312 surrounded by a dielectric material 308, are arrayed as in FIGS. 1 and 2, and are welded to thermally conductive element 304 and window 324. To cool the thermally conductive element 304, a cooling medium 328 is transported across the surface of element 304. The cooling medium 328 is enclosed by coolant containment element 332, which can be made of any substance compatible with the coolant chosen. Thermally conductive element 304 and coolant containment element 332 define a coolant containment space. By way of example only, the coolant containment space can be sheet like, with relatively unrestricted flow patterns of coolant medium 328 between conductive element 304 and containment element 332. The coolant medium 328 is chosen to provide good thermal conductivity and high heat capacity. Preferred media also have low dielectric constant and high dielectric strength to minimize leakage of electrical current to ground during lamp operation. Examples of preferred media include glycol and Halon™ based glycol. The flow rate of the coolant should be sufficient to maintain electrode temperature of below about 300° C., when used with Xe as the emitter gas. The coolant is circulated by means of a pump (not shown).

Additionally, in this embodiment, the excimer gas flow in the discharge space 316 is perpendicular to the axis of the electrodes (arrows). This means that the flow of gas is parallel to the electrical field discharges between the electrodes. This configuration permits the formation of a more stable plasma than is possible with the configuration shown in FIG. 2. The increased stability of the plasma permits the output of the lamp to be regulated more closely and within narrower tolerance limits than lamps using other configurations. However, the embodiment shown in FIGS. 3a–3c is more complex and requires more manufacturing steps than the embodiment shown in FIGS. 1 and 2.

Figure 3B:
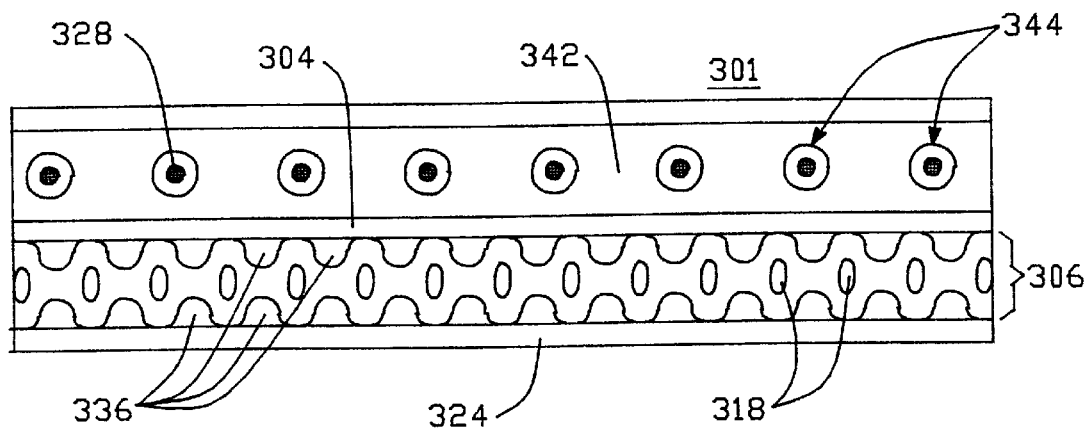
FIG. 3b depicts a side view of an electrode shown in FIG. 3a, depicting grooves for distributing plasma, channels for flow of emitter gas, and cooling means.

FIG. 3b shows an embodiment 301 in which the electrodes enable the perpendicular excimer gas flow and also shows a configuration of cooling elements different from FIG. 3a. The electrode 306 is shown in a side view of a longitudinal section, with ovate grooves 318, and gas channels 336. Gas channels 336 provide passageways through which gas can flow from one discharge space 316 to the adjacent discharge space. These gas channels may be of rounded contours as shown, or may be of any other convenient shape. The gas channels 336 should be sufficiently numerous and of sufficient size to provide little impediment to the flow of gas within the device. If the gas channels 336 are too narrow or too few, the pressure drops from one discharge space to the adjacent spaces may be so large as to significantly alter the pressures in the discharge spaces, resulting in inefficient lamp operation. As in the previous examples, the electrodes 306 are welded to a thermally conductive material 304 and to the window 324.

Additionally, FIG. 3b shows a cooling block 342 is adjacent and in thermal contact with thermally conductive material 304. Coolant channels 344 for coolant fluid 328 are within the cooling block 342, are oriented perpendicularly to the electrodes, and serve to carry excess heat away from the electrodes. The coolant channels are connected to a coolant pump and reservoir (not shown).

Figure 3C:
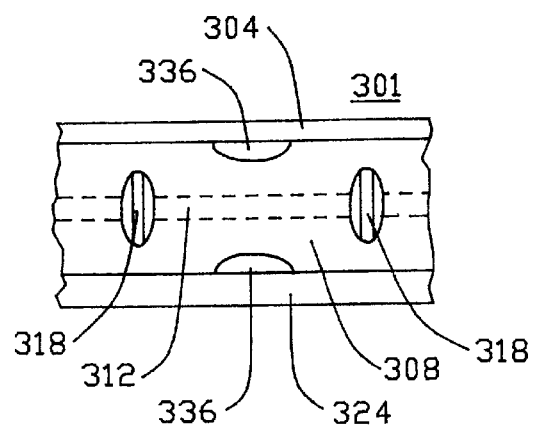
FIG. 3c depicts a side view of the electrode body shown in FIG. 3b, showing the orientation of gas channels and grooves.

FIG. 3c shows more details of construction of the embodiment shown in FIG. 3b, including the electrode 306. The orientations of conductive elements 312, dielectric elements 308, grooves 318, Window 324, thermally conductive element 304, and ovate gas channels 336 are shown.

Example 3

In another embodiment 400 of the invention, shown in FIG. 4, the cooling block 442 has cooling channels 430 to accommodate flow of coolant 428 in one direction, and alternate cooling channels 430 accommodate flow of coolant 428 in another direction. In this embodiment, the cooling channels are oriented parallel to the electrodes. This configuration will tend to even out the temperature throughout the device, resulting in more consistent radiation from all parts of the lamp. As in previous figures, electrodes 406 comprise a conductive element 412 within a dielectric element 408. The electrodes 406 are welded to thermally conductive material 404, which is welded to adjacent layer 410, which may be the same or of different composition as material 404. Electrodes 406 are also welded to window 424 using glass cement, glass frits, thermocompression or other welding means 420

Example 4

Figure 5A:
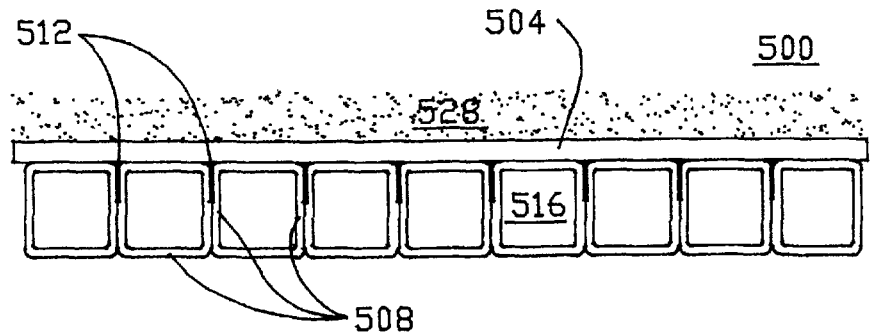
FIG. 5a depicts an embodiment of the invention in which an array gas discharge tubes are interspersed with electrodes.
Figure 5B:
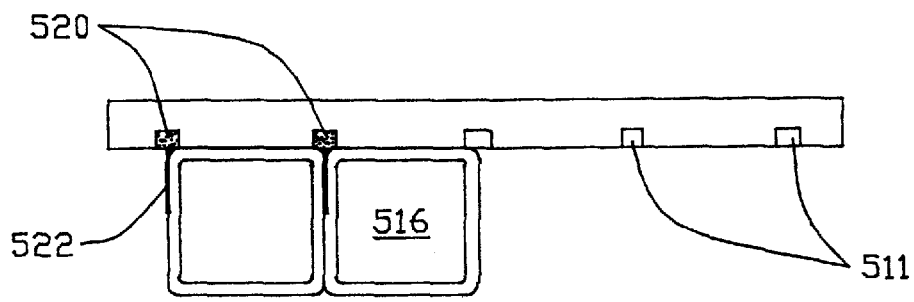
Figure 5C:
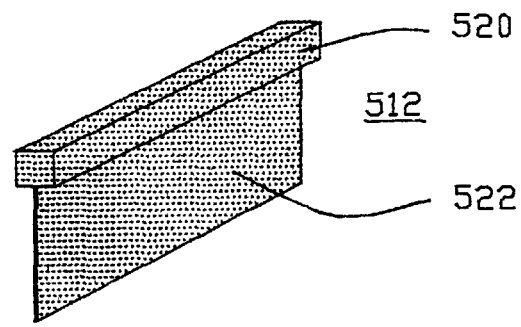

Example 4 demonstrates another embodiment of lamp 500 (FIG. 5a–FIG. 5c). In this device, as shown in FIG. 5a, the thermally conductive material 504 is attached to gas discharge tubes 508, which are of rectangular cross section. These tubes are made of any suitable UV or VUV-transparent material as described above. The discharge tubes define discharge spaces 516 which contain the emitter gas as described above. The thermally conductive material 504 is cooled by coolant 528 which is circulated over the material 504 by a pump (not shown). The thermally conductive material 504 can be of beryllium oxide, aluminum nitride, or other material with high thermal conductivity. FIGS. 5b and 5c depict the electrodes 512 of this embodiment. Electrodes 512 comprise an attachment portion 520 which is inserted into mating grooves 511 in material 504. This configuration provides mechanical, electrical and thermal contact between the electrode and the surrounding elements. Electrode plate 522 is thin, being between 10 $\mu$m and 1000 $\mu$m in thickness, and extends from about ¼ of the distance to about the entire distance along the side of discharge tube 508. The electrodes can be made by thin film deposition or other techniques.

Electrodes are arrayed in pairs, one of each pair being connected to one pole of the AC source (not shown) and the other of each pair being connected to the other pole of the AC source. Discharge tube 508 is made of a material with sufficient dielectric properties to provide the necessary capacitance and resistance to electrical flow to initiate and maintain dielectric discharge conditions. Additionally, discharge tube 508 is made of a material which is transparent to the wavelengths of the radiation desired.

This configuration provides good heat transfer from the electrodes and discharge tubes, and serves as the electrical connection to the power supply. Additionally, this configuration does not require the manufacture of combined conductive element/dielectric electrodes as in Examples 1–3.

Figure 5D:
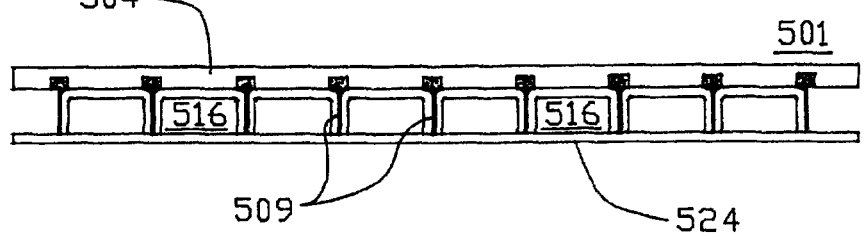
FIG. 5d depicts an embodiment of the invention in which the discharge space is bounded by a transparent window.

In another embodiment 501 of this type of lamp, shown in FIG. 5d, the discharge tube is replaced by a U-shaped discharge element 509. The window 524 in this embodiment is not necessarily made of the same material ias the U-shaped element 509. For example, element 509 can be of quartz or ceramic, with window 524 being transparent to the generated radiation. Window 524 is welded using glass cement, glass frits, or thermocompression to the U-shaped element 509 to provide a pressure-tight seal. As in previous embodiments, the electrodes 512 are in thermal contact with a thermally conductive material 504.

Example 5

A different type of electrode configuration 600 is shown in FIG. 6a–FIG. 6b. In one configuration of this embodiment (FIG. 6a), gas discharge tubes 608 define gas discharge spaces 616, and are spaced apart to permit insertion of electrodes 612 between tubes 608. Electrodes 612 are supported by supports 620 enabling the electrodes to be situated near the mid-portion of the gas discharge tubes 608 Gas discharge tubes 608 are mounted on thermally conductive material 604, made of suitable material with high thermal conductivity such as beryllium oxide or aluminum nitride. The electrode array is cooled by coolant fluid 628 which is circulated by a pump (not shown).

Electrodes 612 can be made of tantalum wire encased tightly in dielectric material as described above in previous examples, or may be in the form of a thin coiled wire 614 inside an inner electrode space 615 which may optionally be cooled internally by a flow of coolant (arrows) (FIG. 6b). The use of deionized water as coolant provides both cooling and electrical contact between the wire electrode element 614 and the wall of the electrode 613. Additional cooling of the electrode and the discharge tube 608 can be by another cooling space 629 containing a fluid of high thermal conductivity, circulated by a pump separate from that used to circulate coolant 628. The discharge tubes are welded to window 624 using methods described for previous embodiments of the invention.

Another embodiment 601 of the invention is shown in FIG. 6c. In this embodiment, U-shaped discharge elements 609 are welded to window 624 with the electrodes 612 of FIG. 6b held in place with supports 620 thereby defining gas discharge spaces 616. In this embodiment, cooling is primarily via the internal electrode cooling means 614 described in FIG. 6b.

Example 6

An alternative embodiment 700 is shown in FIG. 7a. Device 700 comprises a series of discharge tubes 709 abutting each other, in a planar array, with the edges of the discharge tubes 709 defining cusps 710 between them. Each tube 709 is hemi-cylindrical in cross section, and is made of a suitable dielectric material. The edges of discharge tubes 709 are welded to window 724 which permits the transmission of radiation. The discharge tubes 709 and window 724 define gas discharge spaces 716. Electrodes 712 are spaced between the discharge tubes 709, for example only, in the cusps 710 such that activation of electric discharge elicits excimer radiation in discharge space 716. Electrodes 712 are located within a coolant space defined by the discharge tubes 709 and the thermally conductive material 704. The coolant space is filled with coolant fluid 728, which is circulated by a pump (not shown), thereby cooling the electrodes and the discharge space. Coolant 728 should have a sufficiently low dielectric constant and sufficiently high dielectric strength to minimize the likelihood that the coolant would be a pathway for electrical current flow between electrodes 712.

Another embodiment 701 (FIG. 7b) provides for direct cooling of the electrodes. In this embodiment, electrodes 712 are partially imbedded within dielectric material 705 and are partially exposed to coolant 728, held in a coolant space defined by the dielectric material 705 and a coolant wall 732. In this type of electrode configuration, the dielectric discharge is not immediately between electrodes 712, but rather is in the discharge space 716 which is above the dielectric material 705. Electric fields generated by the electrodes 712 is induced at the surface of dielectric layer 705 directly over electrodes 712. When a sufficient voltage threshold is reached, electrical current flows from one part of the dielectric surface 705 to a nearby part, thereby generating the plasma within discharge space 716. Plasma dispersion depressions 718 are shown in the dielectric material 705. The dispersions depressions 718 can be in, for example, grooves, dimples, cylinders, ovals, or other convenient shapes. Spherical ceramic or quartz spacers 726 are welded to the dielectric layer 705 and to the window 724 to maintain the proper thickness of the discharge space 716. Spacers need not be spherical, but need only be of sufficiently similar size to provide support for window 724 without causing undue mechanical stress on the parts. These spacers can be spread throughout the discharge space 716 in a variety of patterns and matrices (see FIG. 7*d*). In this embodiment, coolant 728 must have a sufficiently low dielectric constant and sufficiently high dielectric strength so as to not provide a pathway for electrical current between electrodes 712.

FIG. 7*c* depicts another embodiment 702 of the invention. In this case, electrodes 714 are placed in recesses within the dielectric layer 705. Other elements of this embodiment are labeled as in FIG. 7*b*. In this way, the electrodes may be thin, in the range of about 100 nm to about 1000 $\mu$m, preferably in the range of about 100 nm to about 500 $\mu$m, and even more preferably about 200 $\mu$m.

By making the electrodes thin, the lateral capacitance between the electrodes in the dielectric layer is higher than the sum of the capacitances of the dielectric layers above the electrodes and the discharge gas in the discharge space. Thus, the preferred current flow is from one electrode through the dielectric layer, through the gas, and through the other part of the dielectric layer to the second electrode, rather than between the electrodes directly.

The coolant 728 preferably has sufficient thermal conductivity and heat capacity to maintain electrode temperature below about 300° C., and preferably has sufficiently low dielectric constant and sufficiently high dielectric strength to prevent current flow to electrical ground through the cooling system. Suitable coolants include glycol and Halon™ based glycol.

FIG. 7*d* shows a top view of embodiments 701 or 702 showing the array of spacer elements 726. The array may be, by way of example only, in the form of a matrix as shown, being over the underlying electrodes 712 or 714. Alternatively, the spacers 726 can be arrayed in any other convenient way that provides sufficient support for window 724 shown in FIGS. 7*b*–7*c* to provide sufficient strength to withstand the pressure difference between discharge space 716 and the exterior of the device. Spacers 726 can be approximately spherical as shown, or can be rod-like. However, spherical spacers can be arrayed close together and still maintain sufficient spaces between them to permit unrestricted flow of emitter gas in the discharge space 716. If rods are used for spacers, they preferably are segments short enough to permit unrestricted emitter gas flow.

Example 7

Figure 8:
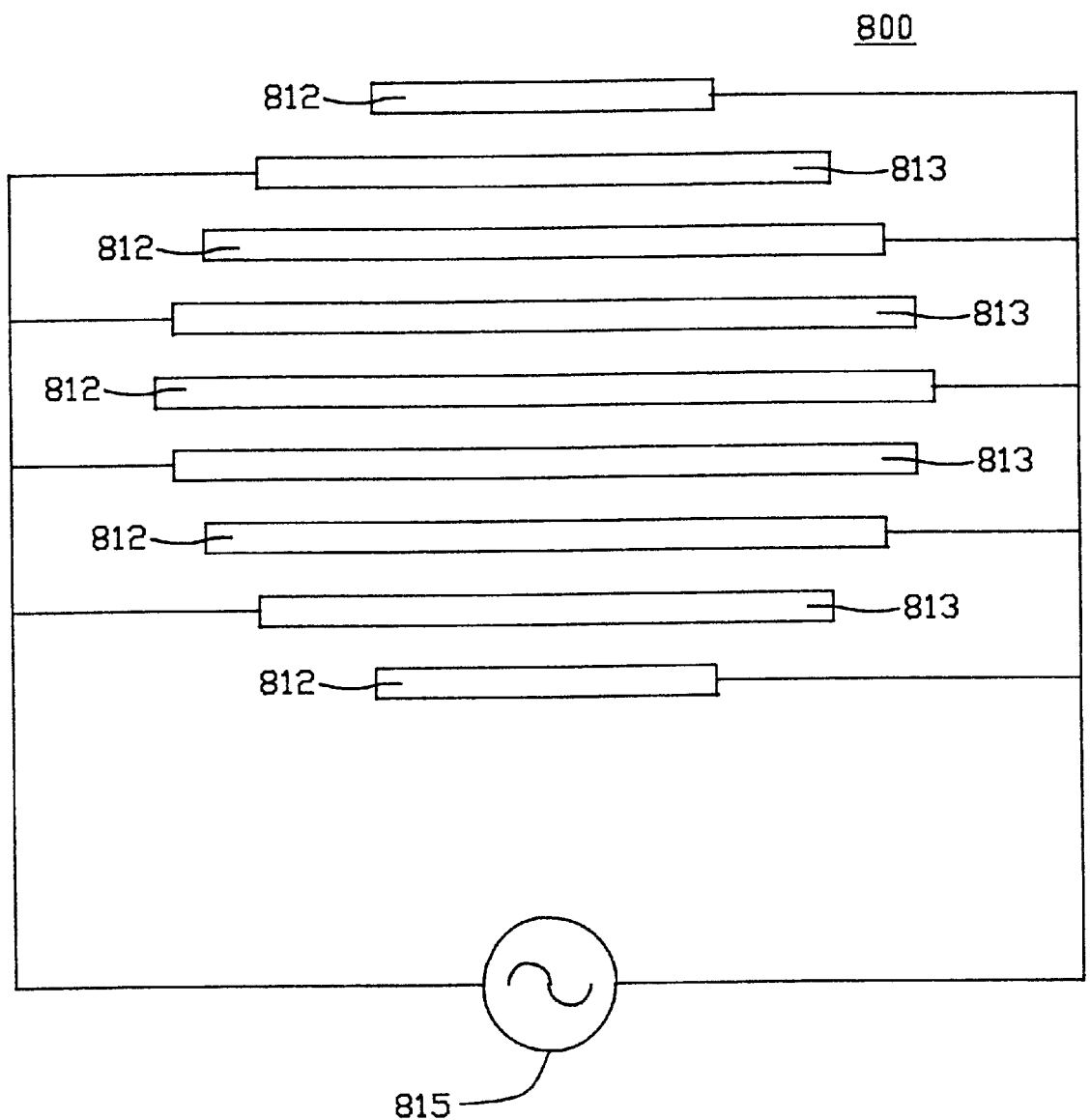
FIG. 8 depicts an array of electrodes arranged to provide a circular area of radiation emission.

FIG. 8 shows an alternative embodiment 800 providing a circular radiation source. The radiation pattern of the device is determined by the lengths of the electrodes 812 and 813. Electrodes 812 are connected to one pole of an AC source 815, and electrodes 813 are connected to the other pole of AC source 815.

While the present invention has been described with reference to the alternative embodiments described above, those embodiments are offered by way of example, not by way of limitation. Those of ordinary skill in the art will be enabled by this disclosure to add to or modify the embodiments of the present invention in various obvious ways. Accordingly, such modifications and additions are deemed to lie within the spirit and scope of the invention as set out in the appended claims.

What is claimed is:

1. A silent discharge radiator comprising:

at least two electrodes;

walls delimiting a discharge space containing said electrodes, said discharge space being adapted to be filled with a gas capable of emitting radiation under dielectric discharge conditions, at least one wall of said discharge space being substantially transparent to a wavelength of the emitted radiation;

wherein at least one of said electrodes comprises a conducting element imbedded within a dielectric material having physical discontinuities.

2. The radiator of claim 1 wherein said at least one of said electrodes has an electrode axis with a length and wherein the physical discontinuities provide a plurality of discharge sites along the length of said at least one of said electrodes.

3. The radiator of claim 1 wherein the physical discontinuities comprise a plurality of depressions in the dielectric material of said at least one electrode.

4. The radiator of claim 3, wherein said at least one electrode has an electrode axis and wherein the depressions comprise grooves in the dielectric which each define a groove axis, said groove axes being substantially perpendicular to the axis of the electrode.

5. The radiator of claim 4, wherein said grooves have ends and the ends of the grooves subtend about 90° of angle relative to the centers of said electrodes.

6. The radiator of claim 1 including a plurality of said electrodes, wherein the physical discontinuities decrease the resistance of the dielectric material between selected portions of adjacent electrodes relative to the resistance of the dielectric material between other areas of the adjacent electrodes.

7. The radiator of claim 1 wherein each physical discontinuity creates an area of higher capacitance.

8. The radiator of claim 1, wherein a wall of said discharge space has an inlet port whereby said gas is introduced into said discharge space, and wherein a wall of said discharge space has an outlet port, whereby said gas is exhausted from said discharge space.

9. The radiator of claim 1, wherein a getter is placed within the gas discharge space to decontaminate said gas.

10. The radiator of claim 1, wherein said electrode has an electrode axis and wherein the direction of the flow of gas is substantially perpendicular to the electrode axis.

11. The radiator of claim 1, wherein said electrode has an electrode axis and wherein the direction of the flow of gas is substantially parallel to the electrode axis.

12. The radiator of claim 1 wherein the physical discontinuities comprise a plurality of thickenings of the dielectric material of said at least one electrode.

13. A silent discharge radiator comprising:

a plurality of electrodes wherein each of said electrodes comprises a conducting element imbedded within a dielectric material, each electrode having an electrode axis;

walls delimiting a discharge space, said discharge space containing the electrodes, said discharge space being adapted to be filled with a gas capable of emitting radiation under dielectric discharge conditions, and wherein at least one wall delimiting said discharge space is substantially transparent to a wavelength of the emitted radiation; and a plurality of physical discontinuities which distribute sites of dielectric discharge associated with at least an electrode.

14. The radiator of claim 13 including means for cooling each electrode.

15. The radiator of claim 14, wherein said means for cooling comprises providing thermal contact between each electrode and a cooling fluid which flows past each of said electrodes.

16. The radiator of claim 15, wherein the flow of cooling fluid is substantially perpendicular to the electrode axis.

17. The radiator of claim 15, wherein the flow of cooling fluid is substantially parallel to the electrode axis.

18. The radiator of claim 15 wherein, the fluid of the cooling means is sufficient to maintain electrode temperature below about 300° C.

19. The radiator of claim 13, wherein each electrode is attached to a thermally conductive base.

20. The radiator of claim 19, wherein said thermally conductive base comprises one of the group consisting of beryllium oxide and aluminum nitride.

21. The radiator of claim 19, wherein said thermally conductive base is cooled by a thermoconductive cooling device.

22. The radiator of claim 19, wherein a cooling fluid cools said thermally conductive base.

23. The radiator of claim 22, wherein said cooling fluid comprises at least one of glycol and Halon™-based glycol.

24. The radiator of claim 19 wherein, the thermally conductive base has sufficient thermal conductivity to maintain electrode temperature below about 300° C.

25. A silent discharge radiator comprising:

a plurality of discharge tubes having at least one wall, said discharge tubes adapted to contain a filler gas capable of emitting radiation under dielectric discharge conditions, wherein at least one wall of each of said discharge tubes is substantially transparent to a wavelength emitted by said filler gas, said tubes having physical discontinuities which distribute sites of discharge; and electrodes being disposed between the discharge tubes.

26. The radiator of claim 25 including means for cooling said electrodes.

27. The radiator of claim 25, wherein said discharge tubes have rectangular cross section.

28. The radiator of claim 25, wherein said discharge tubes and electrodes are in contact with a cooling material sufficient to maintain the temperature of the electrodes below about 300° C.

29. The radiator of claim 28, wherein said cooling material is selected from the group consisting of beryllium oxide and aluminum nitride.

30. The radiator of claim 28, wherein said cooling material comprises at least one of glycol and Halon™-based glycol.

31. The radiator of claim 28, wherein said cooling fluid is at least one of glycol and Halon™-based glycol.

32. The radiator of claim 25, wherein said discharge tubes have an approximately semi-circular cross sectional shape having a curved side and a planar side, and wherein the planar sides of adjacent discharge tubes are coplanar.

33. The radiator of claim 32, wherein the discharge tubes have an inner wall and an outer wall, and wherein adjacent discharge tubes meet to form a cusp between the outer walls of said discharge tubes, and wherein said cusp contains an electrode.

34. The radiator of claim 25, wherein said electrodes are disposed individually between and closely applied to each of said adjacent tubes, and wherein each electrode is cooled by a cooling fluid which flows past each of said electrodes sufficiently to maintain electrode temperature below about 300° C.

35. The radiator of claim 25 wherein said discharge tubes are substantially semi-circular in cross-sectioned shape.

36. The silent discharge radiator of claim 25, wherein said electrodes have a thickness of between about 10 $\mu$m and about 1000 $\mu$m.

37. The silent discharge radiator of claim 25, wherein said electrodes extend between said discharge tubes.

38. The silent discharge radiator of claim 25, wherein said electrodes extend between said discharge tubes having a height, to between about ¼ to about ⅞ of the height of said discharge tube.

39. An electrode for a silent discharge radiator comprising a conductive element imbedded within a dielectric material, and further comprising a multiplicity of physical discontinuities provided in said dielectric material, said discontinuities providing sites of distribution of discharge.

40. The electrode of claim 39, wherein the physical discontinuities comprise depressions.

41. A silent discharge radiator comprising:

a plurality of electrodes, each electrode including a conducting element embedded in a dielectric material;

means for defining on said dielectric material, a matrix of physical discontinuities which define discharge sites; and means for providing a gas capable of emitting radiation under dielectric discharge conditions to said site.

42. The silent discharge radiator of claim 41, wherein the matrix is 2 dimensional.

43. The radiator of claim 41, wherein the physical discontinuities comprise depressions.

44. A silent discharge radiator comprising:

an array of electrodes with each electrode having a conductor associated with dielectric material;

said dielectric material having physical discontinuities which distribute sites for dielectric discharge; and a emitter gas distribution device associated with the discharge sites.

45. The silent discharge radiator of claim 44, further comprising:

a thin window, and a plurality of spacers to support the window in the presence of a pressure differential.

46. The silent discharge radiator of claim 45, wherein the plurality of spacers is selected from the group consisting of spheres and rods.

47. The silent discharge radiator of claim 46, wherein the spacers have cross-sectional dimensions substantially similar to the cross-sectional dimensions of the electrodes.

48. The radiator of claim 44, wherein the physical discontinuities comprise depressions.

49. An electrode for a silent discharge radiator comprising a conductive element imbedded within a dielectric material having physical discontinuities and further comprising a plurality of gas channels in said electrode, wherein said gas channels have a gas channel axis substantially perpendicular to said electrode.

50. A silent discharge radiator comprising:

at least two electrodes;

walls delimiting a discharge space containing said electrodes, said discharge space being adapted to be filled with a gas capable of emitting radiation under dielectric discharge conditions, at least one wall of said discharge space being substantially transparent to a wavelength of the emitted radiation;

wherein said at least one of said electrodes comprises a conducting element imbedded within a dielectric material having a plurality of depressions in the dielectric material of said electrode.

51. The radiator of claim 50, wherein said at least one electrode has an electrode axis and wherein the depressions comprise grooves in the dielectric which each define a groove axis, said groove axes being substantially perpendicular to the axis of the electrode.

52. The radiator of claim 51, wherein said grooves have ends and the ends of the grooves subtend about 90° of angle relative to the centers of said electrodes.

53. A silent discharge radiator comprising:

a stacked array of adjacent discharge tubes comprising a dielectric material, each discharge tube having two substantially parallel sidewalls and two other walls, said sidewalls of adjacent discharge tubes being closely apposed to each other, said discharge tubes adapted to contain a filler gas capable of emitting radiation under dielectric discharge conditions, wherein at least one of said other walls of each of said discharge tubes is substantially transparent to a wavelength emitted by said filler gas, said dielectric material having physical discontinuities which distribute sites of dielectric discharge; and plate electrodes being disposed between the sidewalls of said adjacent discharge tubes.

54. The silent discharge radiator of claim 53, wherein said sidewalls have a width and said plate electrodes have sufficient area to substantially cover said sidewalls.

55. A silent discharge radiator comprising:

an array of discharge tubes comprising a dielectric material, each discharge tube having sidewalls and two other walls, wherein at least one of said other walls of each of said discharge tubes is substantially transparent to a wavelength emitted by a filler gas, said discharge tubes adapted to contain said filler gas capable of emitting radiation under dielectric discharge conditions, said dielectric material having physical discontinuities which distribute sites of dielectric discharge;

said discharge tubes mounted on a thermally conductive material;

said electrodes being disposed between and adjacent to said sidewalls of said adjacent discharge tubes, thereby defining a space between said electrode, said sidewalls of adjacent discharge tubes and said thermally conductive material.

56. A silent discharge radiator comprising:

an array of discharge tubes containing a filler gas capable of emitting radiation under dielectric discharge conditions, said tubes comprising a dielectric material, each tube having at least one surface being substantially transparent to a wavelength emitted by said filler gas, said dielectric material having physical discontinuities which distribute sites of dielectric discharge;

said discharge tubes mounted on a thermally conductive material; and electrodes being disposed between and adjacent to said discharge tubes.

* * * * *